United States Patent [19]

Sasagawa

[11] Patent Number: 5,055,893
[45] Date of Patent: Oct. 8, 1991

[54] LIGHT-EMITTING DIODE ARRAY WITH REFLECTIVE LAYER

[75] Inventor: Teruo Sasagawa, Kanagawa, Japan

[73] Assignee: Eastman Kodak Company, Rochester, N.Y.

[21] Appl. No.: 647,969

[22] Filed: Jan. 30, 1991

[30] Foreign Application Priority Data

Apr. 23, 1990 [JP] Japan .................................. 2-108489

[51] Int. Cl.$^5$ .............................................. G01L 33/00
[52] U.S. Cl. ......................................... 357/17; 357/45; 357/4; 357/16; 372/45; 372/46; 372/50
[58] Field of Search ........................ 357/15, 56, 55, 17, 357/45, 4; 372/45, 46, 50, 43

[56] References Cited

U.S. PATENT DOCUMENTS

| | | | |
|---|---|---|---|
| 4,616,241 | 10/1986 | Biefeld et al. | 357/17 X |
| 4,730,207 | 3/1988 | Yamazaki | 357/17 X |
| 4,868,614 | 9/1989 | Yamazaki | 357/45 X |
| 4,943,970 | 7/1990 | Bradley | 357/17 X |
| 4,949,351 | 8/1990 | Imanaka | 357/17 X |
| 5,020,066 | 5/1991 | Iga et al. | 357/17 X |

OTHER PUBLICATIONS

Dumke, "Simple Planar Double-Heterojunction Laser Structure", *IBM Technical Disclosure Bulletin*, vol. 16, No. 4, Sep. '73, p. 1186.

Blum et al., "Solid State Light-Emitting Diodes", *IBM Technical Disclosure Bulletin*, vol. 13, No. 9, Feb. 1971, p. 2494.

Blum et al., "Double Heterojunction Laser Arrays", *IBM Technical Disclosure Bulletin*, vol. 15, No. 7, Dec. 1972, p. 2345.

Blum et al., "Integrated Multicolor Light-Emitting Diode Array", *IBM Technical Disclosure Bulletin*, vol. 15, No. 2, Jul. 1972, pp. 445-446.

*Primary Examiner*—William Mintel
*Attorney, Agent, or Firm*—Raymond L. Owens

[57] ABSTRACT

A light-emitting diode array has an active layer on a surface of a substrate and a multiple reflective layer between the substrate and the active layer. The active layer is of a semiconductor material which emits light when subjected to carrier injection. The multiple reflective layer is formed of a plurality of pairs of layers of semiconductor materials having different refractive indexes. The layer of the multiple reflective layer which is adjacent the active layer has a higher energy gap than that of the active layer. The layers of the multiple reflective layer which have the higher refractive index have a smaller energy gap than the wavelength of the light emitted by the active layer.

17 Claims, 3 Drawing Sheets

LIGHT-EMITTING DIODE ARRAY WITH REFLECTIVE LAYER

FIELD OF THE INVENTION

The present invention relates to a light-emitting device, and more particularly to a heterojunction light-emitting diode array for use as a printing light source in an optical printer, the said array comprising a multiplicity of light-emitting diodes closely arrayed on a single substrate.

BACKGROUND OF THE INVENTION

A light-emitting diode (LED) array consists of multiple P-N or P-I-N junction LEDS fabricated on a single substrate. An advantage of a light-emitting diode array is that it can be used to process image information with relative ease, by electrically controlling the discrete diodes. Because of this, light-emitting diode arrays are being improved and applied in a variety of ways.

One example relates the use of printers as hard-copy data output devices. With the increasing importance of electronic information in today's world, printers need to be able to print faster and at higher densities in order to cope not only with the growing amounts of information, but also with the inclusion of image information in the form of graphs, drawings, photographs and the like. One way of achieving this is to use light-emitting diode arrays as the light sources in printers.

Laser printers, which employ a laser light source, and LED printers, which employ an LED array as the light source, are two examples of non-impact optical printers. A laser printer requires the use of a mechanical mechanism such as a rotating polygonal mirror for the scanning laser beam, and a corresponding complex optical system. An LED printer, on the other hand, only requires that the light-emitting diode array are controlled to switch on and off. As an LED printer is therefore structurally straightforward requiring no mechanical moving parts, using instead an optically magnifying lens array, it is possible for LED printers to be smaller, faster and more reliable than laser printers.

FIG. 4 is a cross-sectional illustration of a conventional homojunction type LED array 8 used in an LED printer. For simplicity only two light-emitting diodes (hereinafter also referred to as light-emitting elements) are shown. With reference to the figure, the array 8 comprises a substrate 10 of n-type conductivity GaAs having a layer 12 of n-type conductivity GaAsP of about 15 microns thick on a surface thereof. Spaced apart zinc doped regions 16 of p-type conductivity and about 1.5 microns deep are in the layer 12. On the surface of the GaAsP layer 12 is a masking layer 14 of $SiN_x$ which has openings 15 therethrough over the p-type conductivity regions 16. P-electrodes 18 are on the p-type conductivity regions 16 and an n-electrode 20 is on the surface of the substrate 10 opposite the GaAs layer 12. An antireflection layer 22 of $SiN_x$ covers the masking layer 14 and the p-type regions 16. The antireflection layer 22 is removed from the non-light-emitting element portions to form a p-electrode 18 bonding pad. In the array 8, the light-emitting element is formed by the P-N junction at the interface between the n-type conductivity GaAsP layer 12 and the p-type conductivity regions 16.

The array 8 is made by epitaxially depositing the n-type conductivity GaAsP layer 12 on the substrate 10 by the use of vapor-phase epitaxy (VPE). The masking layer 14 is then deposited on the GaAsP layer 12 and is provided with the openings 15 using standard photolithographic and etching techniques. Zinc is then diffused into the GaAsP layer 12 through the openings 15 in the masking layer 14 to form the p-type regions 16. The electrodes 18 and 20 are then deposited on the p-type conductivity regions 15 and the substrate 10 followed by the deposition of the antireflection layer 22.

Two problems encountered when such a light-emitting diode array is used in a printer, unlike when individual LEDs are used, are crosstalk between adjacent light-emitting elements, and variation in characteristics from element to element.

In the type of conventional light-emitting diode array 8 shown in FIG. 4, the n-type conductivity GaAsP layer 12 has a high internal absorption index which is utilized to prevent crosstalk between adjacent elements, while variation in the characteristics arising non-uniformities in the fabrication process is reduced by using only selective diffusion in forming the light-emitting elements.

However, the light emitting diode array thus formed contains numerous lattice defects owing to a lack of lattice matching between the n-type conductivity GaAsP layer 12 used as the light-emitting material and the n-type conductivity GaAs substrate 10. As a result there is considerable non-conformity of the material itself, so the emission efficiency is low. In addition, because the P-N junction is a homojunction with a very low injection efficiency, it is difficult to improve the emission efficiency.

The AlGaAs single heterojunction type light-emitting diode array 28 shown in FIG. 5 was developed previously to overcome the drawbacks of the conventional GaAsP light-emitting diode array.

With reference to FIG. 5, the array 28 comprises a substrate 30 of p-type conductivity GaAs having a layer 32 of p-type conductivity $Al_xGa_{1-x}As$ on a surface thereof. The layer 32 is 10 microns thick and is doped with zinc to a concentration of $5 \times 10^{17}$ impurities/$cm^3$. On the layer 32 is a layer 34 of n-type conductivity $Al_yGa_{1-x}As$ which is 5 microns thick and doped with tellurium to a concentration of $8 \times 10^{17}$ impurities/$cm^3$. A layer 36 of n+ type GaAs is on the layer 34. The layer 36 is 0.1 microns thick and is doped with tin to a concentration of $5 \times 10^{18}$ impurities/$cm^3$. For emitting light with a wavelength in the region of 720 nm, the aluminum composition is set at x=0.2 and y=0.5.

The p-type conductivity layer 32 and the n-type conductivity layer 34 are etched so that the layer 34 and a portion of the layer 32 forms spaced mesas 44, each of which defines a separate light-emitting diode. The layer 36 is on a portion of the layer 34 of each mesa 44 to form a contact layer for the diode. An n-electrode 38 is on the layer 34 on each mesa 44 and a p-electrode 40 is on the surface of the substrate 30 opposite the layer 32. An antireflection layer 42 of $SiN_x$ is over the mesas 44 and the exposed surface of the layer 32.

The array 28 is made by epitaxially depositing the layers 32, 34 and 36 in succession on the substrate 30 using liquid phase epitaxy (LPE). Then, n-electrodes 38 and p-electrode 40 are formed by deposition, and the unnecessary portions of the n-electrode 38 are removed by photolithography and plasma etching. The GaAs layer 36 is selectively etched so as to leave the n-electrode 38 portions. Photolithography and chemical etching are then used around the light-emitting regions so as to form the mesa-shaped light-emitting regions 44, with the etching extending about 1 micron into the layer 32. Plasma CV is then used to form the antireflection layer 42. This is followed by the use of heat treatment to form ohmic contacts for the n-electrode 38 and p-electrode 40, which completes the fabrication of the heterojunction light-emitting diode array 38.

Structurally, this type of heterojunction light-emitting diode array consists of discrete high-luminance LEDs arranged into a single array. The use of a heterojunction provides an improvement in the injection efficiency, and by using the n-type conductivity $Al_yGa_{1-y}As$ layer 34 which is transparent to the light emitted by the light-emitting p-type conductivity $Al_xGa_{1-x}As$ layer 32, energy attenuation caused by internal absorption is avoided, enabling an emission efficiency to be achieved that is several times higher than that achievable with the homojunction light-emitting diode array 8 of FIG. 4.

However, there are problems with the LED arrays described above. As mentioned, unlike when single, discrete LEDs are involved, in an array of LEDs consisting of a multiplicity of light-emitting elements closely arranged on a single substrate, it is important to reduce optical crosstalk between elements. For this, in the light-emitting diode array 28 of FIG. 5, the n-type conductivity $Al_yGa_{1-y}As$ layer 34 used as a transparent window has to be completely removed between elements by etching, and in addition non-mesa portions of the emission region have to be etched to a certain minimum depth to reduce optical bleeding.

It is known that the diffusion length of minority carrier electrons injected into the active layer from the heterojunction is in the order of 10 microns, meaning the active layer has to be etched to at least about 10 microns in order to reduce crosstalk and optical bleeding and attain optimum emission efficiency. However, owing to the difficulty of achieving uniform etching with a good level of reproducibility, the result has tended to be a degradation in characteristics.

In the case of single LEDs, by using a double heterojunction structure in which the p-type conductivity $Al_xGa_{1-x}As$ layer 32, the active layer, is one micron thick of thinner, under which is formed a p-type conductivity $Al_yGa_{1-y}As$ layer with a large Al mixed crystal ratio, the injected carriers can be efficiently confined in the small-energy-gap p-type conductivity $Al_xGa_{1-x}As$ layer 32, considerably reducing internal light absorption and increasing overall efficiency. However, although this might improve the overall emission efficiency, the high refractive index of the active layer means that most of the light is not emitted but reflected, resulting in a very low efficiency in the order of just several percent. Thus, such a light-emitting diode array is not a solution.

SUMMARY OF THE INVENTION

An object of the present invention is therefore to provide a light-emitting diode array that offers improved emission efficiency and is able to suppress crosstalk between adjacent light-emitting elements without any loss of reliability or reproducibility.

The present invention attains this object by a light-emitting diode array which comprises an active layer which emits light when subjected to carrier injection on a surface of a substrate, and a layer adjacent the active layer which confines the injected carriers in the active layer, reflects light from the active layer and confines and absorbs light moving between adjacent light emitting diodes.

More particularly, the present invention attains this object by a light-emitting diode array comprising multiple reflective layers formed by alternating semiconductor layers with different refractive indexes between the substrate and the active layer, in which the layer adjacent to the active layer has a higher energy gap larger than that of the active layer, and the higher refractive-index layer has a smaller energy gap than the wavelength of the light emitted by the active layer.

With the light-emitting diode array thus constituted in accordance with this invention, the high energy gap of the reflecting semiconductor layer adjacent to the active layer makes the semiconductor layer serve as a barrier layer to the injected carriers of the active layer. Since therefore the injected carriers are efficiently confined in the active layer the active layer can be made sufficiently thin without any loss of light emission efficiency, and the etching process facilitated. Moreover, as the multiple reflective layer reflects back towards the light emitting surface of the active layer light propagating in the opposite direction to the light emitting surface, a further improvement in light emission efficiency can be realized.

Also, by giving the high refractive index semiconductor layer an energy gap that is smaller than the wavelength of light emitted by the active layer, light from the active layer confined in this high refractive index semiconductor layer is efficiently absorbed, suppressing crosstalk between adjacent light-emitting elements.

BRIEF DESCRIPTION OF THE DRAWINGS

Further features of the invention, its nature and various advantages will become more apparent from the following detailed description taken in conjunction with the accompanying drawings in which.

DETAILED DESCRIPTION OF THE INVENTION

Figure 1:
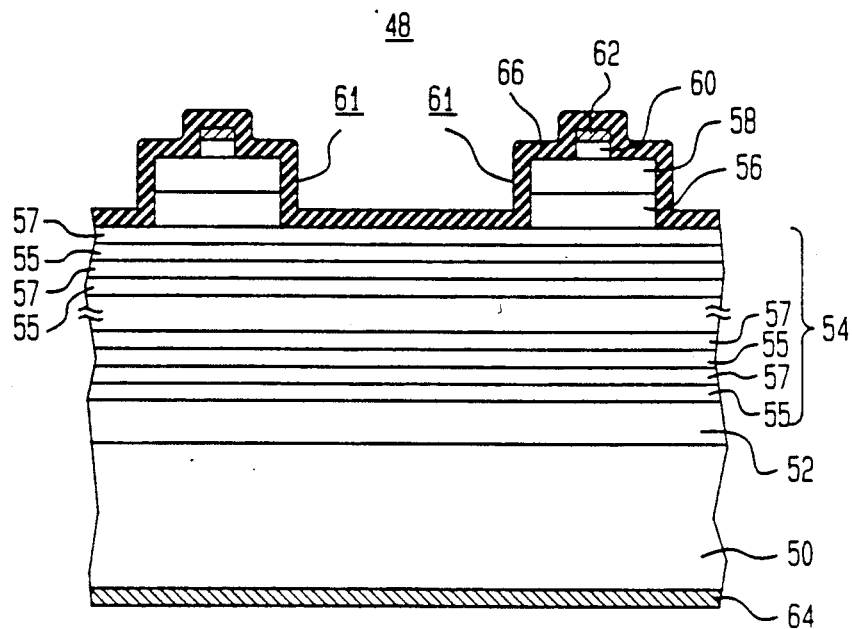
FIG. 1 is a cross-sectional view of a first embodiment of a light-emitting diode array in accordance with the present invention.

FIG. 1 is a cross-sectional view of a first embodiment of a light-emitting diode array 48 in accordance with the present invention. For simplicity, only two light-emitting elements are shown.

With reference to FIG. 1 of the drawing, the array 48 comprises a substrate 50 of n-type conductivity GaAs having on a surface thereof a buffer layer 52 of n-type conductivity GaAs. The substrate 50 is doped with silicon to a concentration of $1 \times 10^{18}$ impurities/cm$^3$, and the buffer layer 52 is of a thickness of 0.2 microns and is doped with selenium to a concentration of $1 \times 10^{18}$ impurities/cm$^3$. On the buffer layer 52 is a semiconductor multiple reflecting layer 54 which is made up of N-pairs (where N is an integer) of layers 55 and 57 of n-type conductivity $Al_yGa_{1-y}As$ and n-type conductivity AlAs respectively. The layers 55 and 57 are doped with selenium to a concentration of $1 \times 10^{18}$ impurities/cm$^3$. On the reflecting layer 54 is an active layer 56 of p-type conductivity $Al_xGa_{1-x}As$ that is 0.5 microns thick and doped with zinc to a concentration of $5 \times 10^{18}$ impurities/cm$^3$. A cladding layer 58 of p-type conductivity $Al_zGa_{1-z}As$, which is 1.5 microns thick and doped with zinc to a concentration of $5 \times 10^{18}$ impurities/cm$^3$, is on the active layer 56 followed by a contact layer 60 of p+ type conductivity GaAs, which is 0.5 microns thick and doped with zinc, to a concentration of $5 \times 10^{19}$ impurities/cm$^3$. For the emission of light at a wavelength of around 670 nm, the aluminum (Al) content is set at x=0.3, y=0.1 and z=0.7.

The active layer 56 and the cladding layer 58 are etched to form spaced mesas 61, each of which defines a separate light-emitting diode element. The contact layer 60 is defined to extend across a portion of cladding layer 58 of each mesa 61. A p-electrode 62 is on the contact layer 60 on each mesa 61 and a n-electrode 64 is on the surface of the substrate 50 opposite the buffer layer 52. An antireflection coating 66 of $SiN_x$ is over each of the mesas 61 and the exposed portions of the reflecting layer 54.

The array 48 is made by epitaxially depositing the layers 52, 55, 57, 56 and 58 on the substrate 50 in succession using metal organic chemical vapor deposition (MOCVD). Next, the n-electrode 64 and p-electrode 62 are formed by deposition, and photolithography and plasma etching are used to selectively remove the p+ type conductivity GaAs contact layer 60 around the p-electrode 62. Photolithography and $H_2SO_4:H_2O_2:H_2O = 1:2:40$ chemical etching are then used to remove the epitaxial layers around the regions that form light-emitting elements, down as far as the n-type $Al_yGa_{1-y}As$/n-type AlAs semiconductor multiple reflecting layer 54 so as to form the mesa-shaped light-emitting regions 61. Plasma CVD is then used to form an antireflection $SiN_x$ coating 66, and heat treatment is used to form ohmic contacts for the p-electrode 62 and n-electrode 64.

With the light-emitting diode array thus fabricated by the above process, by setting the number of pairs of the semiconductor multiple reflecting layer 54 at around N=25 and setting the thickness of the high refractive index n-type conductivity $Al_yGa_{1-y}As$ semiconductor layer 55 and the low refractive index n-type AlAs semiconductor layer 57 at ¼ the wavelength of the emitted light, high reflectivity of the light from the active layer 56 is obtained by the reflection of the light from the multiple interfaces between the layers.

In the multiple reflecting layer 54, since the n-type conductivity semiconductor layer on the side opposite to the light emitting surface side, meaning the n-type conductivity AlAs semiconductor layer 57 adjacent to the p-type conductivity $Al_xGa_{1-x}As$ active layer 56, has a higher proportion of Al than the active layer 56, and hence a larger energy gap, it can be made to function as a carrier barrier confining carriers injected into the active layer 56 by applying a forward bias across electrodes 62 and 64.

The thickness of the active layer 56 can therefore be reduced to 0.5 microns, or if necessary to less than several hundred angstroms, far thinner than in a conventional arrangement. Furthermore, as the height of the light-emitting mesa regions 61 can be made much lower than in the conventional arrangement, non-uniformity arising from the etching process also can be reduced.

In the multiple reflecting layer 54, also, the Al mixture ratio y of the high refractive index n-type conductivity $Al_yGa_{1-y}As$ semiconductor layer 55 is set at a level that does not exceed the Al ratio x of the active layer 56, the energy gap of the layer 55 is small relative to the wavelength of the light emitted by the active layer 56, enabling light from the active layer to be efficiently absorbed.

Thus the multiple reflecting layer 54 of this first embodiment confines the injected carriers, reflects light from the active layer and confines and absorbs light moving towards an adjacent light-emitting element, thereby providing good emission efficiency while at the same time suppressing crosstalk between adjacent light-emitting elements.

Figure 2:
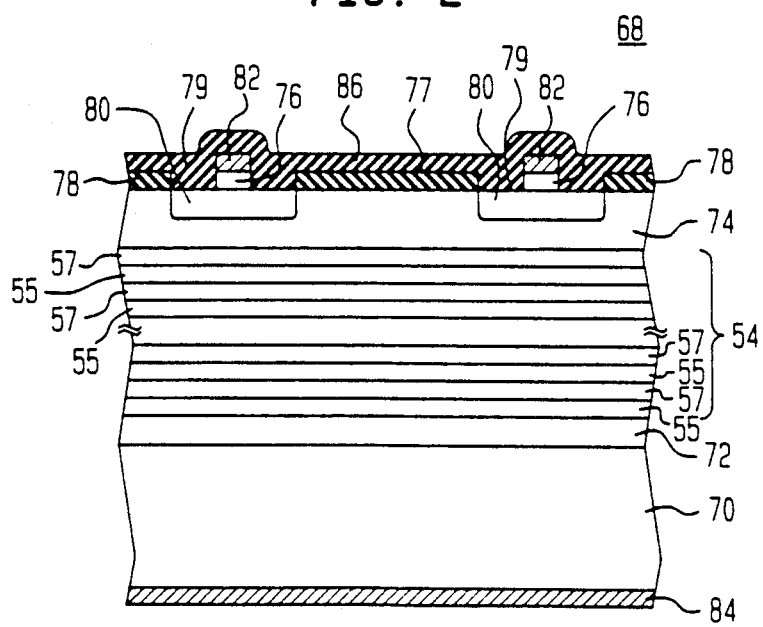
FIG. 2 is a cross-sectional view of a second embodiment of a light-emitting diode array in accordance with the present invention.

FIG. 2 is a cross-sectional view of a second embodiment of the light-emitting diode array 68 of the invention. For simplicity, only two light-emitting elements are shown.

With reference to FIG. 2 of the drawing, the array 68 comprises a substrate 70 of n-type conductivity GaAs having on a surface thereof a buffer layer 72 of n-type conductivity GaAs. The substrate is doped with silicon to a concentration of $2 \times 10^{18}$ impurities/cm$^3$, and the buffer layer 72 is of a thickness of 0.2 microns and is doped with silicon to a concentration of $1 \times 10^{18}$ impurities/cm$^3$. On the buffer layer 72 are multiple pairs of semiconductor layers 55,57 which comprise a reflecting layer 54 which is like the reflecting layer 54 previously described with regard to the array 48 of FIG. 1. Layers 55 and 57 are of n-type conductivity $Al_yGa_{1-y}As$ and AlAs, respectively. An active layer 74 of undoped (and therefore intrinsic [I]) $Al_xGa_{1-x}As$ of a thickness of 1.7 microns is on the reflecting layer 54. Spaced apart p-type conductivity isolated regions 80, which are doped with zinc, are in the active layer 74 and are of a depth of 1.2 microns. Each of the isolated regions 80 forms with the active layer 74 and the reflecting layer 54 a P-I-N junction constituting a light-emitting element.

A masking layer 78 of $SiN_x$ is on the active layer 74 and has openings 79 therethrough over the isolated regions 80. A p+ type conductivity GaAs contact layer 76 is on each of the isolated regions 80 within the openings 79 in the masking layer 78. A p-electrode 82 is on each of the contact layers 76 and (a)n-electrode 84 is on the surface of the substrate 70 opposite the buffer layer 72. An antireflective coating 86 of $SiN_x$ is over the masking layer 78, the isolated regions 80 and the p-electrodes 82.

The array 68 is made by epitaxially depositing on the substrate 70 the layers 72, 55, 57, and 74 in succession by MOCVD. The masking layer 78 is then deposited on the active layer 74 and provided with the openings 79 by photolithography and etching. Zinc is then diffused into the active layer 74 through the openings 79 in the masking layer 78 to form the isolated regions 80. A layer of p+ type conductivity GaAs is then epitaxially deposited on the isolated regions 80 through the openings 79 in the masking layer 78 to form the contact layers 76.

Next, the p-electrode 82 and n-electrode 84 are formed and chemical etching using $NH_4OH:H_2O_2 = 1:10$ is then used to selectively remove the p− type conductivity GaAs contact layer 76 around the p-electrode 82. A $SiN_x$ layer 86 is then applied to form an antireflective coating. This $SiN_x$ layer 86 is removed from the non-light-emitting element portions to form a p-electrode 82 bonding pad. For the emission of light at a wavelength of around 720 nm, the Al content is set at x=0.2, y=0.1.

With the light-emitting diode array 68 of the second embodiment thus constituted, arranging the multiple reflecting layer 54 adjacent to the active layer 74 for confining the injected carriers, as in the first embodiment, imparts the effect of a heterojunction structure to the intrinsic layer 74. The portions of the active layer 74 between the reflecting layer 54 and the Zn diffused regions 80 is thin, about 0.5 microns thick. Again, light from the active layer 74 is reflected by the multiple interfaces between the layers 55 and 57 of reflecting layer 54, and light which forms crosstalk is absorbed by the high-refractive-index n-type $Al_yGa_{1-y}As$ semiconductor layer 55.

In this second embodiment, also, selectively using just Zn diffusion in forming the emission region reduces variation caused by process non-uniformity.

Figure 3:
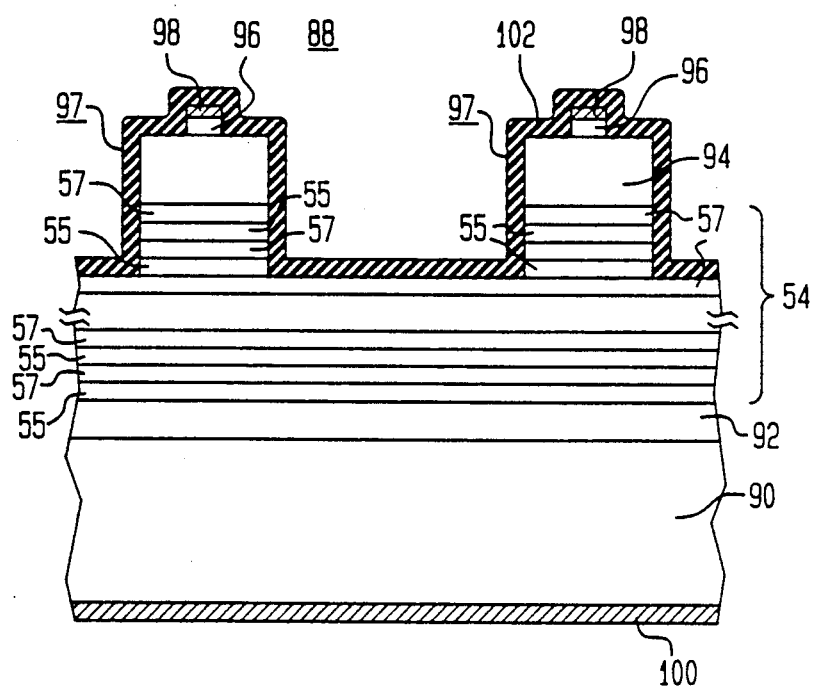
FIG. 3 is a cross-sectional view of a third embodiment of a light-emitting diode array in accordance with the present invention.
Figure 4:
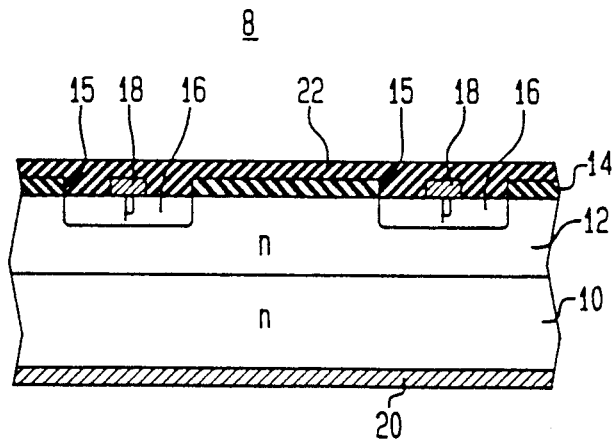
FIGS. 4 and 5 are cross-sectional views of two different conventional (prior art) light-emitting diode array arrangements.
Figure 5:
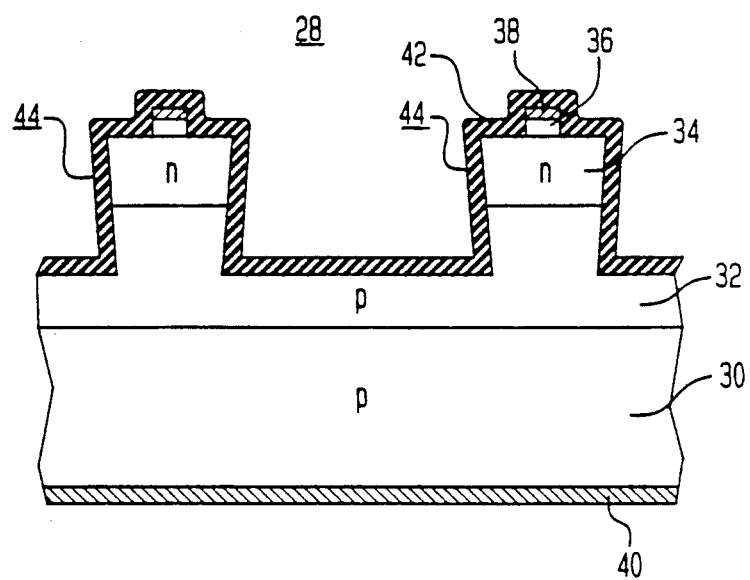

FIG. 3 is a cross-sectional view of a third embodiment 88 of the light-emitting diode array of the invention. For simplicity, again, only two light-emitting elements are shown.

With reference to FIG. 3 of the drawing, the array 88 comprises a substrate 90 of n-type conductivity GaAs having on a surface thereof a buffer layer 92 of n-type conductivity GaAs. The substrate 90 is doped with silicon to a concentration of $2 \times 10^{18}$ impurities/cm$^3$, and the buffer layer is 0.2 microns in thickness and is doped with selenium to a concentration of $1 \times 10^{18}$ impurities/cm$^3$. On the buffer layer 92 is a semiconductor multiple reflecting layer 54 of the same structure as the reflecting layer of the array 48 shown in FIG. 1 in that it comprises multiple pairs of layers 55 and 57 of n-type conductivity $Al_yGa_{1-y}As$ and n-type conductivity AlAs. On the reflecting layer 54 is an active layer 94 of p-type conductivity $Al_xGa_{1-x}As$ which is 5 microns thick and is doped with zinc to a concentration of $1 \times 10^{18}$ impurities/cm$^3$. Finally, a contact layer 96 of p+ type conductivity GaAs, which is 0.5 microns thick and doped with zinc to a concentration of $1 \times 10^{19}$ impurities/cm$^3$, is on the active layer 94. For the emission of light at a wavelength of around 670 nm, the Al content is set at x=0.3 and y=0.7. Portions of the contact layer 96, active layer 94 and the reflecting layer 54 are removed to form mesas 97, each of which forms a light-emitting diode element. A p-electrode 98 is on the contact layer 96 of each mesa 97, and a n-electrode 100 is on the surface of the substrate 90 opposite the buffer layer 92. An antireflection coating 102 of $SiN_x$ covers each of the mesas 97 and the exposed surface of the reflecting layer 54 between the mesas 97.

The array 88 is made by epitaxially depositing on the substrate 90 the layers 92, 55, 57, 94, and 96 in succession using MOCVD. Next, p-electrode 98 and n-electrode 100 are formed by deposition, and photolithography and plasma etching are used to selectively remove the p+ type conductivity GaAs contact layer 96 around the p-electrode 98. Photolithography and chemical etching are then used to remove the epitaxial layers 94, 57 and 59 around the regions that form the light-emitting elements, down as far as and partially into the semiconductor multiple reflecting layer 54 to form the mesa-shaped light emitting regions 97. Plasma CVD is then used to form the antireflection $SiN_x$ coating 102, and heat treatment is used to form ohmic contacts for the p-electrode 98 and n-electrode 100.

In the multiple reflecting layer 54 of the light-emitting diode array 88 thus fabricated by the above process, the n-type conductivity AlAs semiconductor layer 57 adjacent to the active layer 92 has the structure of a single heterojunction, it effectively functions as a carrier stop layer, improving light emission efficiency, while the reflective action of the multiple reflecting layer 54 also enhances emission efficiency.

Also, crosstalk between adjacent light-emitting elements is suppressed as light forming such crosstalk is absorbed by the high-refractive-index n-type conductivity $Al_yGa_{1-y}As$ semiconductor layer.

Although the foregoing descriptions of each embodiment of the light-emitting diode array has been made with reference to specific thicknesses and compositions such as AlGaAs and GaAs, it is to be understood that the invention is not limited thereto. Instead, the compositions may be changed to produce different refractive indexes as required.

Also, although the above embodiments described the use of MOCVD to form semiconductors layers on the substrate, other methods may be used such as GSMBE, MBE, CBE, and LPCVD.

What is claimed is:

1. A light-emitting diode array comprised of a multiplicity of light-emitting diodes arranged on a single substrate, said light emitting diodes comprising:
   an active layer of a semiconductor material which emits light when subjected to carrier injection; and
   a reflective layer adjacent the active layer which confines the injected carriers in the active layer, reflects light from the active layer and confines and absorbs light moving between adjacent light-emitting diodes.

2. The light-emitting diode array of claim 1 in which the reflective layer is between the active layer and the substrate.

3. The light-emitting diode array of claim 2 in which the reflective layer comprises at least one pair of layers of semiconductor materials having different refractive indexes, the semiconductor material of the layer of the pair which is adjacent the active layer having an energy gap that is larger than the energy gap of the active layer and the semiconductor material of the layer of the pair which has the higher refractive index having an energy gap that is smaller than the wavelength of the light emitted by the active layer.

4. The light-emitting diode array of claim 3 in which the reflective layer comprises a plurality of pairs of said layers of semiconductor materials having different refractive indexes.

5. A light-emitting diode array comprised of a multiplicity of light-emitting diodes arranged on a single substrate, each light-emitting diode having an active layer which emits light when subjected to carrier injection, comprising:
   a multiple reflective layer provided between the substrate and the active layer and formed of alternating semiconductor layers with different refractive indexes, the semiconductor layer of the multiple reflective layer adjacent to the active layer having an energy gap that is larger than the energy gap of the active layer, and the semiconductor layers of the multiple reflective layer which have the higher reflective index having an energy gap that is smaller than the wavelength of light emitted by the active layer.

6. A light-emitting diode array comprising:
   a substrate of a semiconductor material of one conductivity type;

a multiple reflective layer of the one conductivity type on a surface of said substrate; and an active layer of a semiconductor material which emits light when subjected to carrier injection on said multiple reflective layer, said active layer being defined to form spaced light-emitting diodes along said substrate;

said multiple reflective layer comprising at least one pair of layers of semiconductor materials having different refractive indexes with the layer of the pair adjacent the active layer having a energy gap that is larger than the energy gap of the active layer and the layer of the pair which is of the higher refractive index having an energy gap that is smaller than the wavelength of the light emitted by the active layer.

7. The light-emitting diode array of claim 6 in which the multiple reflective layer comprises a plurality of pairs of the layers of semiconductor materials having different indexes of refraction.

8. The light-emitting diode array of claim 7 in which the number and thicknesses of the layers of the multiple reflective layer provides the layer with a thickness equal to $\frac{1}{4}$ the wavelength of the emitted light.

9. The light-emitting diode array of claim 6 in which the active layer is of a conductivity type opposite to that of the multiple reflective layer 10. The light-emitting diode array of claim 9 in which the active layer is defined into separate portions spaced along the substrate to form mesas, each of which defines a separate light-emitting diode.

11. The light-emitting diode array of claim lo further comprising a contact layer of a semiconductor material of the same conductivity type as the active layer but of higher conductivity over and electrically connected to each portion of the active layer.

12. The light-emitting diode array of claim 11 further comprising an electrode on each contact layer and an electrode on the surface of said substrate opposite the multiple reflective layer.

13. The light-emitting diode array of claim 12 in which the contact layer is directly on the active layer.

14. The light-emitting diode array of claim 13 further comprising a cladding layer of a semiconductor material of the same conductivity type as the outer layer directly on each portion of the active layer, and each contact layer is on a cladding layer.

15. The light-emitting diode array of claim 7 in which the active layer is undoped, and a plurality of spaced regions of a conductivity type opposite to that of the multiple reflective layer are in the active layer and define the active layer into the spaced light-emitting diodes.

16. The light-emitting diode array of claim 15 further comprising a separate contact layer of a semiconductor material of the same conductivity type as the regions but of higher conductivity on each of the regions.

17. The light-emitting diode array of claim 16 further comprising an electrode on each of the contact layers and an electrode on the surface of the substrate opposite the multiple reflective layer.

* * * * *